(12) United States Patent
Rajasegaran et al.

(10) Patent No.: US 9,627,590 B2
(45) Date of Patent: Apr. 18, 2017

(54) OPTOELECTRONIC DEVICE

(71) Applicant: OSRAM Opto Semiconductors GmbH, Regensburg (DE)

(72) Inventors: Jason Rajakumaran Rajasegaran, Kulim (MY); Sok Gek Beh, Gelugor (MY)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/908,650

(22) PCT Filed: Jul. 30, 2013

(86) PCT No.: PCT/EP2013/066013
§ 371 (c)(1),
(2) Date: Jan. 29, 2016

(87) PCT Pub. No.: WO2015/014393
PCT Pub. Date: Feb. 5, 2015

(65) Prior Publication Data
US 2016/0211421 A1    Jul. 21, 2016

(51) Int. Cl.
*H01L 33/00*   (2010.01)
*H01L 33/48*   (2010.01)
*H01L 33/60*   (2010.01)
*H01L 33/62*   (2010.01)

(52) U.S. Cl.
CPC ............ *H01L 33/483* (2013.01); *H01L 33/60* (2013.01); *H01L 33/62* (2013.01); *H01L 2933/0033* (2013.01); *H01L 2933/0058* (2013.01); *H01L 2933/0066* (2013.01)

(58) Field of Classification Search
CPC ....... H01L 33/483; H01L 33/60; H01L 33/62; H01L 2933/0066; H01L 2933/0033; H01L 2933/0058
See application file for complete search history.

(56) References Cited

U.S. PATENT DOCUMENTS

| 2007/0252227 | A1 | 11/2007 | Fukuda et al. | |
| 2009/0201440 | A1* | 8/2009 | Hamada | G02B 6/0031 349/61 |
| 2012/0091493 | A1 | 4/2012 | Lin et al. | |
| 2012/0314393 | A1* | 12/2012 | Leib | H01L 24/97 361/809 |
| 2015/0115304 | A1* | 4/2015 | Singer | F21V 9/16 257/98 |

FOREIGN PATENT DOCUMENTS

| DE | 10 2007 039 291 A1 | 2/2009 |
| DE | 10 2009 042 479 A1 | 3/2011 |
| EP | 2 031 667 A2 | 3/2009 |

* cited by examiner

*Primary Examiner* — Victor A Mandala
(74) *Attorney, Agent, or Firm* — DLP Piper LLP (US)

(57) ABSTRACT

An optoelectronic device includes a carrier, a housing, and a radiation source that emits electromagnetic radiation arranged on the carrier, wherein the housing is fixed to the carrier by a glue layer, the glue layer is arranged between a first face of the housing and a second face of the carrier, the first face of the housing and the second face of the carrier are arranged at an inclination angle to each other, a distance between the first face and the second face increases from an outer rim in a direction to a middle area of the carrier, and a thickness of the glue layer increases at least partially from the outer rim in the direction to the middle area of the carrier.

14 Claims, 3 Drawing Sheets

OPTOELECTRONIC DEVICE

TECHNICAL FIELD

This disclosure refers to an optoelectronic device.

BACKGROUND

An optoelectronic device is known which comprises a carrier and a housing fixed to the carrier. The housing is fixed by a glue layer arranged between the carrier and the housing. The glue layer should not be too thick and the glue layer should be arranged in predetermined areas of the carrier and the housing. Mounting the housing to the carrier is performed automatically by machines and deposition of the glue layer is also performed automatically by a machine.

It could nonetheless be helpful to provide an optoelectronic device with an improved glue layer such that the glue layer is not arranged outside the housing.

SUMMARY

We provide an optoelectronic device including a carrier, a housing, and a radiation source that emits electromagnetic radiation arranged on the carrier, wherein the housing is fixed to the carrier by a glue layer, the glue layer is arranged between a first face of the housing and a second face of the carrier, the first face of the housing and the second face of the carrier are arranged at an inclination angle to each other, a distance between the first face and the second face increases from an outer rim in a direction to a middle area of the carrier, and a thickness of the glue layer increases at least partially from the outer rim in the direction to the middle area of the carrier.

We also provide a method of producing the optoelectronic device including a carrier, a housing, and a radiation source that emits electromagnetic radiation arranged on the carrier, wherein the housing is fixed to the carrier by a glue layer, the glue layer is arranged between a first face of the housing and a second face of the carrier, the first face of the housing and the second face of the carrier are arranged at an inclination angle to each other, a distance between the first face and the second face increases from an outer rim in a direction to a middle area of the carrier, and a thickness of the glue layer increases at least partially from the outer rim in the direction to the middle area of the carrier, including providing a carrier and a housing, arranging an electromagnetic radiation source on the carrier, wherein the housing includes a first face and the carrier includes a second face, and arranging glue between the first and the second face, wherein the first face of the housing and the second face of the carrier are arranged with an inclination angle between the first and second face, the housing and the carrier are pushed together and the first face and the second face are arranged adjacently, the glue layer is squeezed in a direction to a middle area of the carrier, a distance between the first face and the second face increases from an outer rim in a direction to the middle area of the carrier, and a thickness of the glue layer increases at least along a section in a direction to the middle area of the carrier.

Figure 2:
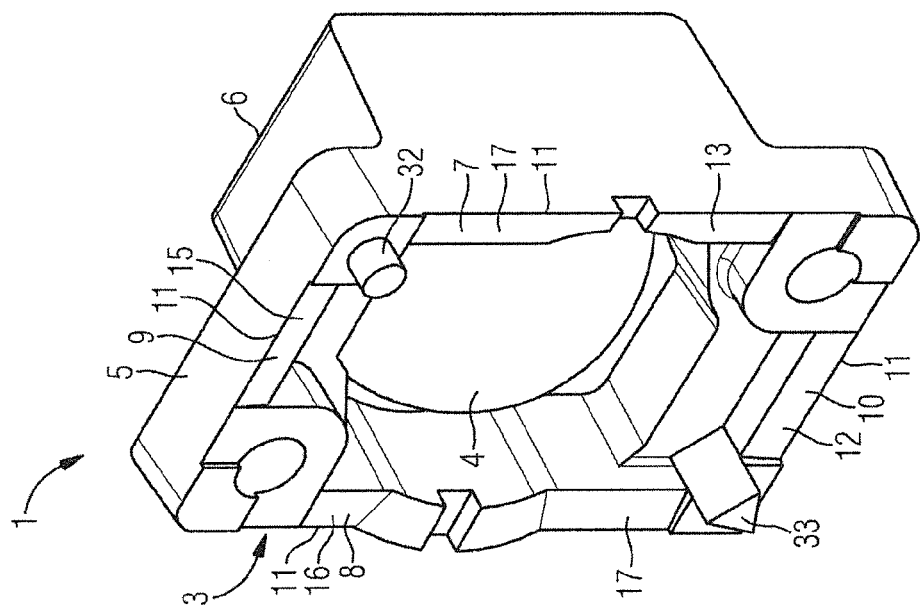
FIG. 2 depicts an isometric view of the housing from a bottom side.

REFERENCE NUMBERS 1 housing
2 top side
3 bottom side
4 lens
5 frame
6 cover
7 first long side
8 second long side
9 first short side
10 second short side
11 outer edge
12 first face
13 first face
14 first face
15 first face
16 first face
17 first face
18 inner edge
19 outer side
20 reference plane
21 angle
22 carrier
23 radiation source
24 second face
25 second face
26 second face
27 second face
28 second face
29 second face
30 distance
31 outer edge
32 first bolt
33 second bolt
34 optoelectronic device
35 glue layer

DETAILED DESCRIPTION

Our optoelectronic device is constructed such that the glue layer is not arranged outside the housing. This is attained by the arrangement of a first face of the housing and a second face of the carrier, whereby the glue layer is arranged between the first face and the second face. The first face and the second face are arranged with an inclination angle between the first and second face, wherein at least along a section, a distance between the first face and the second face increases from an outer rim of the housing in the direction to a middle area of the carrier. Since the two faces are arranged at an inclination angle, the glue disposed between the two faces is moved in the direction of the inner area of the carrier by pushing the housing and the carrier together. The glue is squeezed in the direction of a middle area. Thus, the glue is prevented from squeezing outside the housing. This has the advantage that external edges of the housing are not contaminated by glue.

Furthermore, the entire deposited glue is arranged between the housing and the carrier and provides a sufficient connecting force. No glue is lost for the connecting function and, therefore, the amount of glue that is sufficient for the necessary connecting force can be precisely determined and deposited. Therefore, the optoelectronic device can be processed in a more cost-efficient way. Furthermore, it is not necessary to clean the outer edges of the housing. Additionally, the cross-sectional area of the optoelectronic device is not increased by glue extending from an outer edge of the housing.

The second face may be a plane face arranged in parallel to a middle plane of the carrier. The first face is inclined to a middle plane of the carrier. Therefore, usual carriers with plane faces can be used, for example, a substrate. However, provision of the inclined first face at the housing can be made easier than an inclined face at the carrier.

The first face may be a plane face inclined to a plane second face. The use of plane faces provides a simple and cost-efficient device.

The housing may comprise several first faces and the carrier may comprise several second faces dedicated to corresponding to the first faces. Provision of several first and second faces improves the connecting force between the housing and the carrier.

The housing may comprise at least two first faces arranged at opposite sides of the housing. This arrangement of the first faces improves the connecting force between the housing and the carrier. Also, the carrier comprises two second faces arranged at opposite sides of the carrier point. This improves the connecting force between the housing and the carrier.

The first face may extend to an outer edge of the housing. This improves the usable area of the first face. Furthermore, production of the first face is cheaper.

The glue layer may be arranged with a given distance from an outer edge of the housing. This arrangement securely prevents squeezing out of the glue layer during the mounting process. Thus, it is not necessary to put the housing in a precise determined position referring to the glue layer and it is not necessary to deposit the glue in a precise determined position referring to a mounting position of the housing. Therefore, the mounting process can be performed with larger tolerances.

The arrangement may comprise a light-emitting diode or a laser diode as an electromagnetic radiation source. Production of optoelectronic devices with electromagnetic radiation diodes is performed automatically. Therefore, the arrangement improves the quality of the produced optoelectronic device.

The inclination angle between the first face and the second face may be larger than 1 degree. Our experiments have shown that an inclination angle larger than 1 degree depending on the viscosity of the glue provides a sufficient squeezing effect of the glue in direction to the middle area of the carrier.

The inclination angle between the first face and the second face may be larger than 1 degree and smaller than 20 degrees. Our experiments have shown that an angle larger than 20 degrees between the first and the second face may not improve squeezing of the glue in the direction of the middle area of the carrier. For the usual viscosity of used glues, an angle of about 5 degrees between the first and the second face seems to provide good connecting forces between the housing and the carrier and furthermore seems to provide a sufficient squeezing of the glue in direction of the middle area that prevents the glue from flowing beside an outer edge of the housing.

The device may comprise a housing with an optical lens that generates an electromagnetic radiation. Housings with an optical lens have to be precisely fixed to the carrier, wherein the position of the optical lens should not change during the life of the device. Therefore, a strong connecting force between the housing and the carrier is necessary. Additionally, housings with optical lenses are relatively small and therefore provide only a small first face. Therefore, the glue has to be positioned precisely and the available first face should be covered by the glue without squeezing the glue outside of the housing. Since the first face is relatively small, the glue that is, for example, deposited on a second face of the carrier can cover only a small area of the second face.

The arrangement may comprise a glue layer with a cross-sectional area with the shape of a triangle. This shape of the glue layer provides a sufficient connecting force between the housing and the carrier and also prevents squeezing of the glue layer out of the housing.

The above-named properties, features and advantages and also the way in which they can be attained can be more clearly understood in connection with the following description of the examples which are explained referring to the figures.

Figure 1:
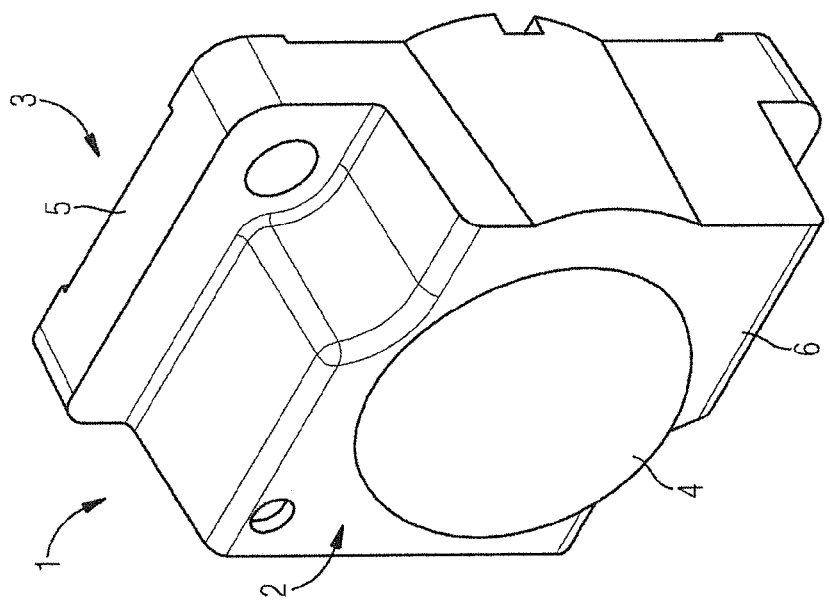
FIG. 1 depicts an isometric view of a housing from a top side.

FIG. 1 depicts in an isometric view a housing 1 with a top side 2 and a bottom side 3. The housing comprises an optical lens 4 arranged in a middle area of the housing 1.

FIG. 2 depicts an isometric view on the bottom side 3 of the housing 1. Basically, the housing 1 comprises a frame 5 surrounding a cover 6, wherein the cover 6 has an opening in which the lens 4 is arranged. The frame 5 has a circular shape at the bottom side 3 and surrounds a rectangular area. The frame 5 has two opposite long sides 7, 8 and two opposite short sides 9, 10. The two long sides 7, 8 are arranged in parallel and the two short sides 9, 10 are arranged in parallel. Furthermore, the short sides 9, 10 are arranged perpendicular to the long sides 7, 8. The frame 5 may also have different shapes. The bottom side of the frame 5 is confined at an outer side of the housing by an outer edge 11. The outer edge 11 defines a border between the bottom side 3 of the frame 5 and outer side faces of the housing 1. The bottom side 3 of the frame 5 comprises several first faces 12 to 17 that extend from the outer edge 11 to an inner edge 18. The inner edge 18 confines the frame 5 at an inner side. The first faces 12 to 17 are arranged in an inclined position referring to a plane area, wherein the first faces are inclined starting from the outer edge 11 in the direction to the inner edge 18 with a predetermined inclination angle. The inclination angle may vary between 1 degree and 20 degrees or more. Furthermore, the inclination angle may have a value of about 5 degrees. The frame 5 at the bottom side 3 comprises at two opposite edges bolts 32, 33 that protrude from the bottom side 3 of the frame 5.

Figure 3:
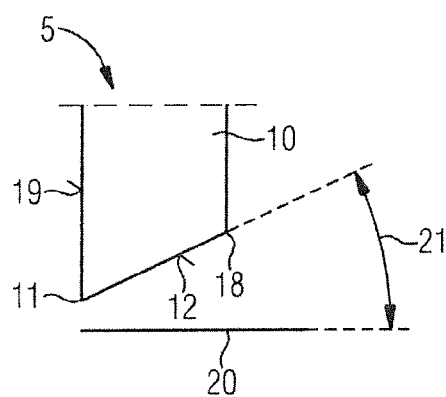
FIG. 3 depicts an inclined first face of the housing.

FIG. 3 shows a partial cross-section of the first face 12. FIG. 3 depicts the inclination angle 21 between the first face 12 and a reference plane 20. The reference plane 20 is arranged perpendicular to an outer side 19 of the frame 5. The reference plane 20 is also parallel to a middle section of a carrier. The outer edge 11 of the frame 5 protrudes more than the inner edge 18. Several first faces 12 to 17 may have the same shape which means that the first faces 12 to 17 are arranged in an inclined plane referring to the reference plane 20. All the first faces 12, 13, 14, 15, 16, 17 may be arranged in an inclined plane with an inclination angle 21 as shown in an exemplary manner for the first face 12 in FIG. 3.

Figure 4:
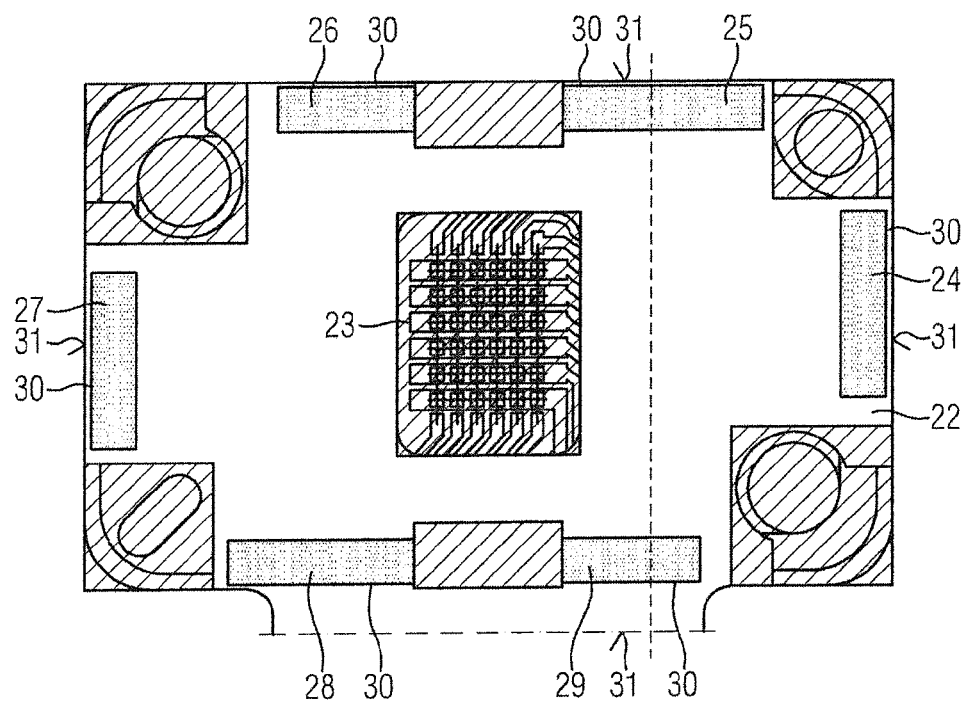
FIG. 4 depicts a schematic view onto a topside of a carrier.

FIG. 4 shows a top view on a carrier 22 having a rectangular shape and comprising an electromagnetic radiation source 23. The electric component 3 may be a light-emitting diode or a laser diode. The carrier 22 comprises several second faces 24 to 29 arranged on the topside of the carrier 22. Also, the electric component 23 is arranged on the topside of the carrier 22. The second faces 24 to 29 represent glue-dispensing areas on which glue is dispensed before mounting and fixing the housing 1 to the carrier 22. The second faces 24 to 29 are arranged corresponding to the positions of the first faces 12 to 17 of a housing 1 such that the first faces are arranged on the second faces after mounting the housing on the carrier. The carrier 22 may comprise only one second face or at least two or more second faces as shown in FIG. 5.

Before mounting the housing 1 to the carrier 22, glue is dispensed on the second faces 24. The second faces 24 are arranged at a predetermined distance 30 from an outer edge 31 of the carrier 22. The distance between the outer edge 31 and the second face 24 prevents that the glue flows over the outer edge 31. To mount the housing 1 on the carrier 22, the housing 1 is put on the carrier 22 and pressed down to the carrier 22. The housing 1 is pushed down to the carrier 22 until the bolts 32, 33 contact the upper side of the carrier 22. During the moving of the housing 1 to the carrier 22, the glue is squeezed out in an inner direction of a middle area of the housing 1 since the first faces 12 to 17 are arranged in an inclined angle as explained in FIG. 3.

Figure 5:
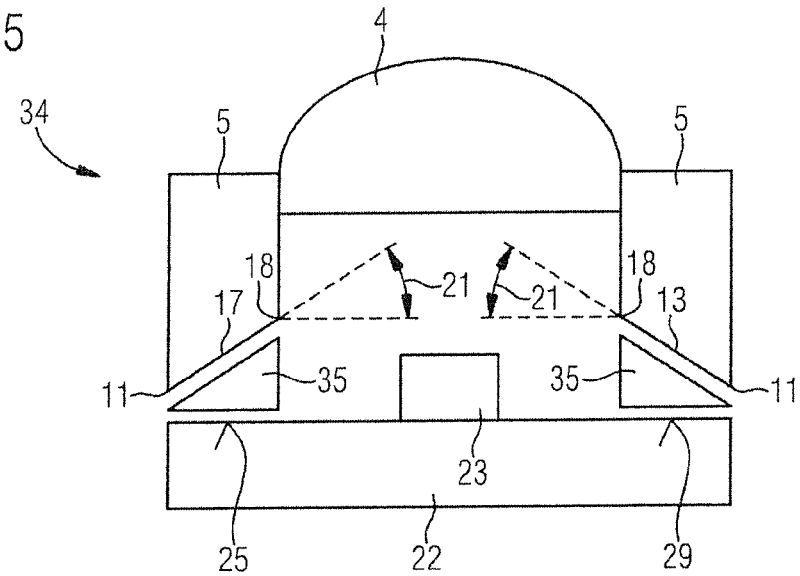
FIG. 5 depicts a schematic cross-sectional view of an optoelectronic device with a carrier and a housing.

FIG. 5 shows a schematic view of a cross-sectional area of an optoelectronic device 34 with a housing 1 fixed by a glue layer 35 to a carrier 22. The carrier 22 may be a substrate, for example, made of semiconductor material or ceramic material or any other suitable material.

Instead of an optical lens 4, a plate may be arranged that is penetrable for electromagnetic radiation, for example, for electromagnetic radiation of a light-emitting diode or a laser diode.

The glue layer 35 has basically a cross-sectional area with the shape of a triangle. The thickness of the glue layer 35 increases starting at an outer side adjacent to the outer edge 11 of the frame 5 increasing in the direction to the inner edge 18. The first faces 13, 17 are arranged in an inclined plane with an inclined angle 21 that is, for example, identical. The angle 21 may vary between 1 degree and 20 degrees or more. The different first faces 12 to 17 may also have different inclination angles 21. Preferably, however, the inclination angles 21 of the first faces are the same.

Figure 6:
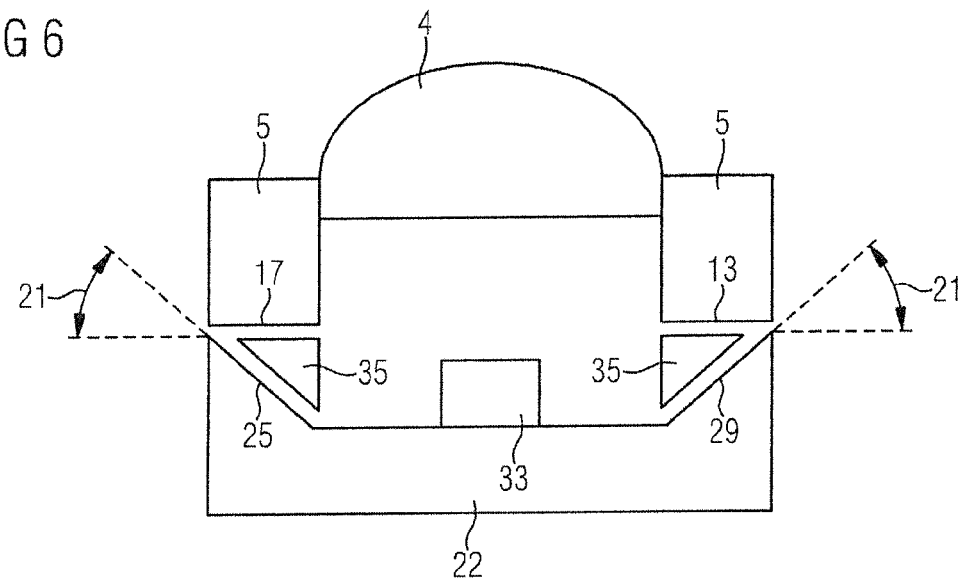
FIG. 6 depicts a schematic cross-sectional view of a further optoelectronic device with a carrier and a housing.

The first faces 12 to 17 may be arranged parallel to a plane area of the carrier 22. In this example, the second faces 24 to 29 may be arranged with an inclination angle so that a glue layer 35 is produced with a thickness that increases from an outer rim in direction to a middle area of the carrier 22. FIG. 6 shows such an example in a schematic view.

Figure 7:
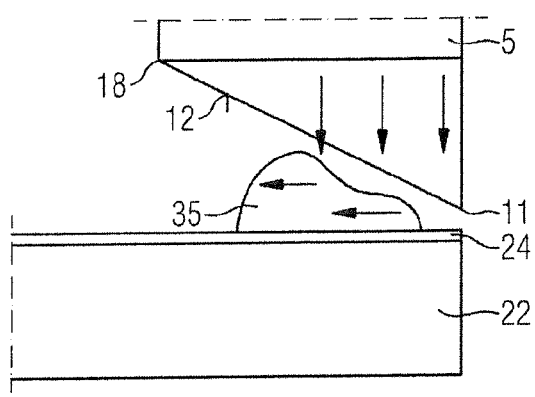
FIG. 7 depicts a schematic view of an arrangement during the mounting process of the housing to the carrier.

FIG. 7 shows a partial cross-sectional area of the housing 1 during the mounting process. The frame 5 is pushed with the first face 12 on a glue layer 35. The glue layer 35 is arranged on a second face 24 of the carrier 22. Due to the inclined arrangement of the first face 12, the glue is squeezed out in direction to a middle area of the carrier 22. This prevents the glue from flowing outside the housing 1 which means in a direction to the outer edge 11 of the frame 5. The glue is forced to move in the direction to the inner edge 18. Movement of the housing 1 is depicted by arrows. Also, movement of the glue, i.e., the squeezing direction, is depicted in the glue layer 35 by arrows.

Our device applies to LED-devices requiring lens mounting to a substrate by using glue. In the lens-mounting process, the glue is dispensed as a glue line or a glue drop on a substrate surface before the lens is mounted onto the substrate. The lens base sitting on the dispensed glue area is a flat surface to provide mechanical stability and adhesion.

The described structure of the optoelectronic device 34 prevents glue from being squeezed out from the external edges 11 of the frame 5 which leads to contamination at the external package area. Therefore, a weak lens adhesion due to insufficient glue amount when the glue has been squeezed out from lens edges is prevented.

Due to the inclined arrangement of the first faces and the second faces, the glue volume and the glue location between the first and the second faces can be precisely controlled. The housing may be part of an optical lens.

The arrangement has the advantage that flow of excessive glue to package outer edges is prevented when the glue volume is increased. Maximum adhesion can be attained by increasing the glue volume. The arrangement can be used for smaller and thicker glue layer thicknesses. For example, the thickness of the glue layer after the mounting of the housing to the carrier may vary between 100 micrometer and 300 micrometer. For example, the thickness of the glue layer 35 may vary by about 30% from an outer side to an inner side.

The invention claimed is:

1. An optoelectronic device comprising a carrier, a housing, and a radiation source that emits electromagnetic radiation arranged on the carrier, wherein the housing is fixed to the carrier by a glue layer, the glue layer is arranged between a first face of the housing and a second face of the carrier, the first face of the housing and the second face of the carrier are arranged at an inclination angle to each other, a distance between the first face and the second face increases from an outer rim in a direction to a middle area of the carrier, and a thickness of the glue layer increases at least partially from the outer rim in the direction to the middle area of the carrier.

2. The device of claim 1, wherein the second face is a plane face arranged in parallel to a middle plane of the carrier, and the first face is inclined to the middle plane of the carrier.

3. The device of claim 1, wherein the first face is a plane face.

4. The device of claim 1, wherein the housing comprises several first faces and the carrier comprises several second faces.

5. The device of claim 1, wherein the housing comprises several first faces and the carrier comprises several second faces, two first faces are arranged at opposite rim areas of the housing, and the second faces are arranged at opposite rim areas of the carrier.

6. The device of claim 1, wherein the first face extends to an outer edge of the housing.

7. The device of claim 1, wherein the glue layer is arranged at a given distance from an outer edge of the housing.

8. The device of claim 1, wherein the radiation source is a light-emitting diode or a laser diode.

9. The device of claim 1, wherein the inclination angle between the first face and the second face is larger than 1 degree.

10. The device of claim 1, wherein the inclination angle between the first face and the second face is larger than 1 degree, and the inclination angle between the first face and the second face is smaller than 20 degrees.

11. The device of claim 1, wherein the housing comprises an optical lens for electromagnetic radiation.

12. The device of claim 1, wherein the glue layer has a cross-sectional area with a triangle shape.

13. A method of producing an optoelectronic device according to claim 1, comprising providing a carrier and a housing, arranging an electromagnetic radiation source on the carrier, wherein the housing comprises a first face and the carrier comprises a second face, and arranging glue between the first and the second face, wherein the first face of the housing and the second face of the carrier are arranged with an inclination angle between the first and second face, the housing and the carrier are pushed together and the first face and the second face are arranged adjacently, the glue layer is squeezed in a direction to a middle area of the carrier, a distance between the first face and the second face increases from an outer rim in a direction to the middle area of the carrier, and a thickness of the glue layer increases at least along a section in a direction to the middle area of the carrier.

14. The method according to claim 3, wherein the housing comprises an optical lens and the electromagnetic radiation source is a light-emitting diode or a laser diode.

* * * * *